United States Patent [19]

Kelley, Jr. et al.

[11] 4,156,185
[45] May 22, 1979

[54] DIRECT CURRENT MEASURING SYSTEM FOR RECTIFIERS

[75] Inventors: Fred W. Kelley, Jr., Media, Pa.; Samuel A. Thompson, Wilmington, Del.

[73] Assignee: General Electric Company, Philadelphia, Pa.

[21] Appl. No.: 852,652

[22] Filed: Nov. 18, 1977

[51] Int. Cl.² .................. G01R 19/00; G01R 19/18
[52] U.S. Cl. ................................. 324/107; 324/119; 324/120
[58] Field of Search ........... 324/107, 119, 127, 158 D; 340/253 E

[56] References Cited

U.S. PATENT DOCUMENTS 3,944,919  3/1976  Jewell et al. .................. 324/107

*Primary Examiner*—Rudolph V. Rolinec
*Assistant Examiner*—Ernest F. Karlsen
*Attorney, Agent, or Firm*—William Freedman; Carl L. Silverman

[57] ABSTRACT

A dc measuring circuit for power rectifiers is described wherein primary line current is utilized to measure direct current output. In the measuring circuit, line current transformers are connected to a multiphase instrument rectifier through a phase shifting current transformer which is adjustable to compensate for differences between the primary and secondary line current phase shift characteristics of the power transformer and any phase shift in the line current transformer. By such compensation, the average value of rectified primary line current in the measuring circuit is maintained independent of the commutating angle of the rectified power current. The dc measuring circuit includes means for providing unity current transformation through the phase shifting current transformer. The dc measuring circuit also includes means for handling the presence of zero sequence current without causing measurement error or circuit damage. The dc measuring circuit also includes means for indicating the blowing of a fuse associated with the power rectifier circuit. In one embodiment, the phase shifting current transformer comprises a double extended wye connected autotransformer. In another embodiment, the phase shifting current transformer comprises a truncated delta autotransformer.

15 Claims, 4 Drawing Figures

DIRECT CURRENT MEASURING SYSTEM FOR RECTIFIERS

BACKGROUND OF THE INVENTION

The present invention relates to the measurement of unidirectional current, and more particularly, to measurement of unidirectional output currents of multiphase power rectifiers.

Many circuits for measuring unidirectional current are known. Among such circuits are those disclosed in U.S. Pat. Nos. 3,281,642, issued Oct. 25, 1966 to Dortort, and 3,944,919, issued Mar. 16, 1976 to Jewell et al, the Jewell et al patent being assigned to the assignee of the present application.

Briefly, the Dortort patent discloses circuits for reducing measurement error due to a 30° power circuit phase shift, as in a simple wye-delta or delta-wye three phase power circuit connection. In one such circuit, Dortort discloses delta connection of the current transformer secondaries associated with the primary line conductors and connection of these secondaries to a dc measuring instrument through a multiphase instrument rectifier. The Jewell et al patent discloses circuits for reducing the measurement error due to power circuit phase shift of 30° as well as other magnitudes of phase shift. In one such circuit, Jewell et al provide current transformers in the input circuit of the power transformer with the current transformer secondary windings connected in wye circuit relation to a three phase instrument rectifier through a phase shifting current transformer. In one form of the Jewell et al circuit, the phase shifting transformer comprises an autotransformer.

Although the circuits disclosed in the Jewell et al patent are successful in many applications, for some applications, these circuits present some problems. One such problem is that the asymmetrical arrangement of the current autotransformers shown in FIGS. 6 and 7 of Jewell et al provide a non-unity magnitude transformation in addition to providing the desired phase transformation. This non-unity current magnitude transformation is undesirable as its presence requires additional current transformation circuitry in order to provide accurate measurement. More particularly, such additional current transformation circuitry must be provided in order that identical magnitude transformation is associated with groups of 6 pulse arrangements that are phase shifted with respect to each other. This allows the accurate summation (or comparison) and the determination of the total group current. Another problem with the circuits disclosed by Jewell et al is that, in some power systems, the power transformer primary circuit may involve a zero sequence current component. In such systems, the presence of the zero sequence component may be due to the distributed capacitance of a power transformer winding neutral to ground. In the Jewell et al circuit, no means are provided for handling the presence of the zero sequence current component. As a result, the presence of the zero sequence current may cause inaccurate measurement due to damage to the measurement circuitry. One means employed to provide zero sequence current capability is to connect the neutral connection of the wye connected current transformer secondaries to the ac terminal of a fourth bridge leg of the multiphase instrument rectifier. This provides zero sequence current protection but causes measurement error in the event that zero sequence current exists. Another problem with the Jewell et al circuit and with the Dortort circuit is that no means are provided for indicating the blowing of a fuse associated with the power rectifier circuit. This means that additional circuitry must be provided to indicate such a condition.

Thus, it is a general object of our invention to provide improved means for utilizing alternating input circuit current to measure dc output current in power rectifier apparatus without introducing error due to power transformer phase shift.

Another object of our invention is to provide such an improved measuring means which further includes means for rendering the current transformation substantially unity without the necessity of providing current transformation circuitry in addition to a phase shifting autotransformer.

Another object of our invention is to provide such an improved measuring means which includes means for handling the presence of zero sequence current without causing measurement error or circuit damage.

Another object of our invention is to provide such an improved measuring means which includes means for indicating a blowing of a fuse associated with the power rectifier circuit.

SUMMARY OF THE INVENTION

In carrying out our invention in one form, we provide a system for measuring the magnitude of direct output current from a multiphase power rectifier having an input circuit including a multiphase power transformer. The power transformer has primary and secondary phase windings connected to provide a phase shift between the multiphase primary and secondary line currents coupled by the power transformer. The system includes line current transformers for measuring each of the primary line currents. A phase shifting current autotransformer includes multiple phase windings coupled by separate magnetizable core members in each phase. The core members are designed for normal operation below saturation. Means are provided for connecting the line current transformer secondary windings to the primary windings of the phase shifting current autotransformer. The phase shifting current autotransformer provides a phase shift which, when combined with the phase shift of the line current transformers, is vectorially equal to the phase shift of the power transformer. A multiphase instrument rectifier is connected to the secondary windings of the phase shifting current autotransformer and a direct current measuring instrument is connected to the output terminals of the instrument rectifier.

In accordance with the present invention, the system further includes means for rendering the transformation ratio of the phase shifting autotransformer substantially unity. In another form of the present invention, the system further includes means for providing system capability for the presence of zero sequence current. In another form of the invention, fuse failure detector means are provided for indicating blowing of a fuse associated with the power rectifier circuit.

BRIEF DESCRIPTION OF THE DRAWINGS

Our invention will be more fully understood and its various objects and advantages further appreciated by referring now to the following specification, taken in conjunction with the accompanying drawings, in which.

DETAILED DESCRIPTION OF THE INVENTION

Figure 1:
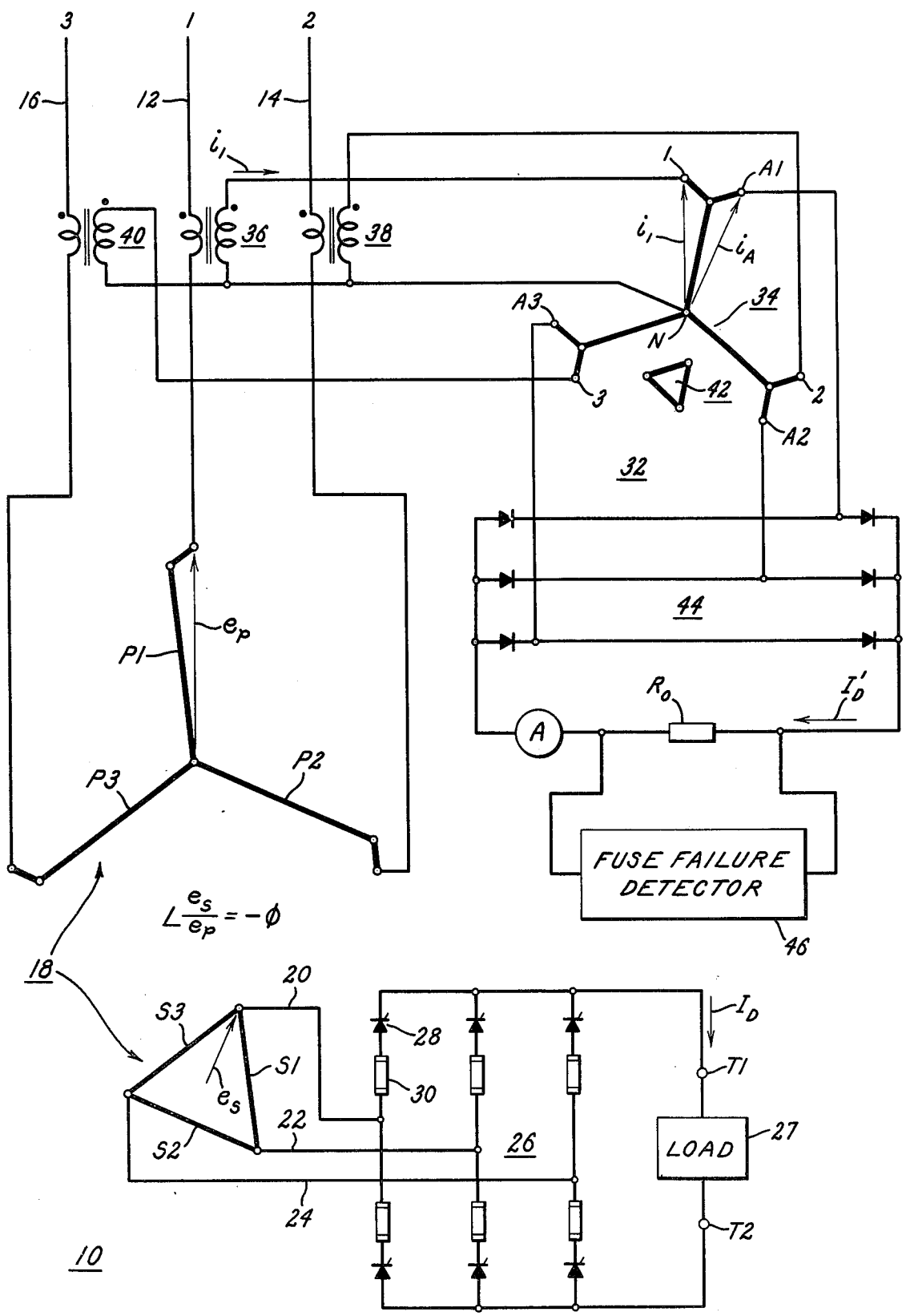
FIG. 1 is a schematic representation of one form of the present invention showing a power rectifier apparatus including a direct current measuring system.

Referring initially to FIG. 1, one form of power rectifier circuit and direct current measuring circuit of the present invention for a three phase power system is generally designated 10. Line conductors 12, 14, 16 carry the three phase current between a source (not shown) and a rectifier power transformer 18. The rectifier power transformer 18 includes primary windings P1, P2, P3 connected in extended wye circuit relation. The power transformer 18 also includes secondary phase windings S1, S2, S3 connected in delta circuit relation and also connected through secondary line conductors 20, 22, 24 to a three phase bridge type power rectifier 26 having direct current output terminals T1, T2, coupled to a load 27. The power rectifier 26 is of any conventional type and may, for example, include appropriately poled thyristors 28 in series and/or parallel relation. Each current path includes a current fuse 30. It is to be appreciated that each of the three legs of the rectifier 26 may comprise a plurality of parallel paths, each of the paths including appropriately poled thyristors and fuses corresponding to 28 and 30.

The direct current measuring circuit is generally designated 32 and includes a phase shifting autotransformer 34 which receives the outputs of the primary line current transformers 36, 38 and 40. The secondaries of the primary line current transformers 36, 38, 40 are wye connected. It is to be noted that the phase shifting autotransformer 34 is similar to the one disclosed in the previously mentioned Jewell et al patent but includes several modifications thereto which will be discussed in detail following a general description of the circuit 10. The phase shifting autotransformer 34 is provided with tertiary windings 42 in order to provide system capability for the presence of zero sequence current. The output of the phase shifting autotransformer 34 is connected to an instrument rectifier 44 and to a dc measuring instrument, designated A. The instrument rectifier 44 also includes a fuse failure detector 46 which is connected across a resistor $R_o$ which is in series circuit relation with the measuring instrument A.

Figure 2:
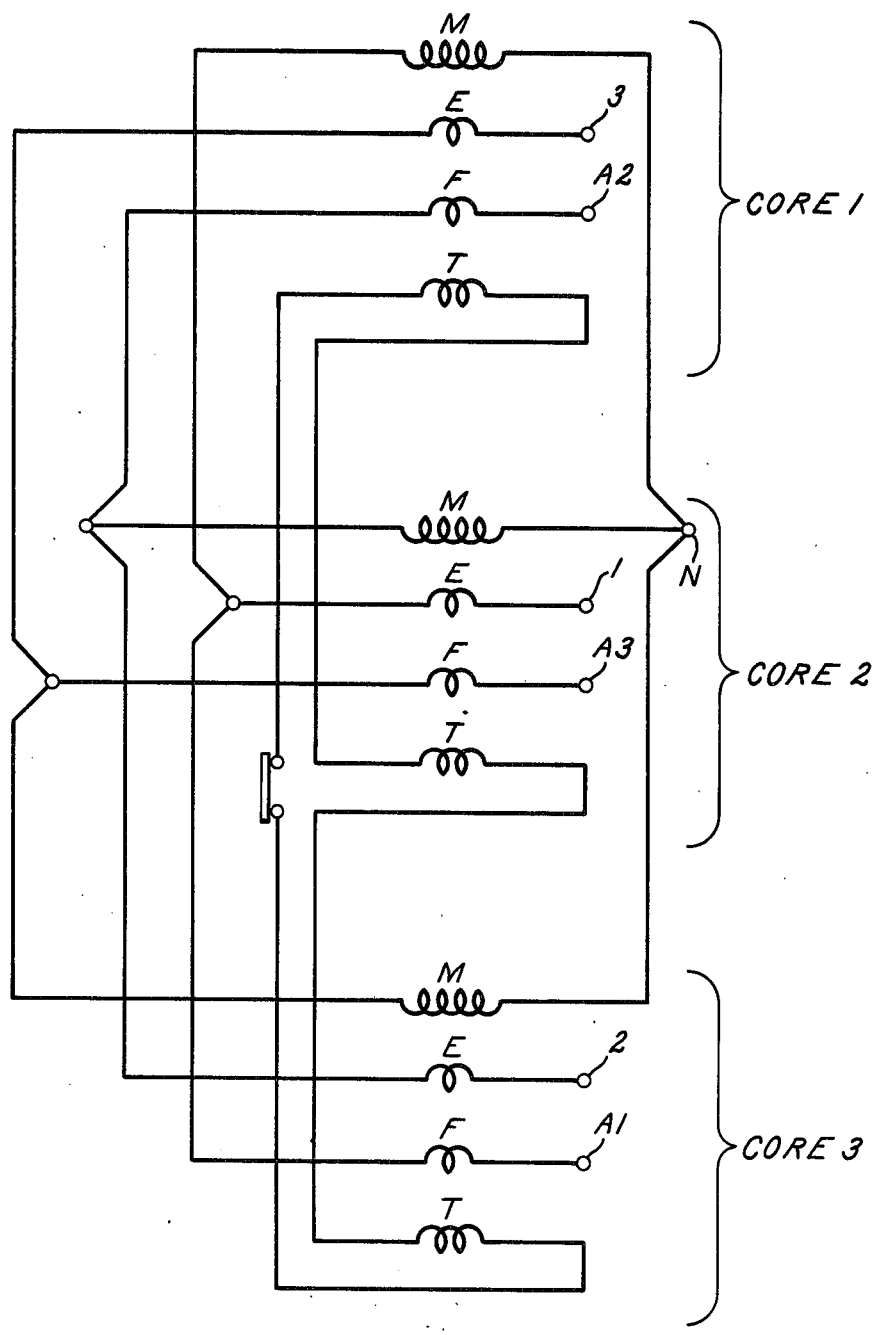
FIG. 2 is an exemplary connection diagram for use in the direct current measuring system of FIG. 1.

Referring more particularly now to the phase shifting autotransformer 34, it is to be noted that the phase shifting autotransformer 34 is in double extended wye form and coupled to the tertiary windings 42. More specifically, in a preferred form, each phase employs a separate magnetizable core member, or core. Each core is encompassed by four windings. For purposes of clarity, an exemplary connection diagram for such an autotransformer 34 is depicted in FIG. 2. Each core includes a main (M), or wye winding, with these windings being connected to a common or neutral terminal (N). Two extension windings (E) and (F) are provided, these windings are appropriately connected to the current transformer connection terminals 1, 2, 3 and to the connection terminals A1, A2, A3 for the instrument rectifier 44. The fourth winding comprises the tertiary winding (T). The tertiary windings (T) for the three cores are connected together in closed delta form. For reference information on transformer and rectifier applications, and symbols therefor, see ANSI Standard C34-2-1968 (R1973), entitled, "Practices and Requirements for Semiconductor Power Rectifiers." This reference depicts various vector diagrams of the type employed in FIG. 1 of this application, see especially, Table 6, beginning on page 49 of this reference. More particularly, items 11 and 12 on page 49 appear to disclose a secondary arrangement, "fork," which is somewhat related to the double extended wye autotransformer 34 of FIG. 1 of this application.

The fuse failure detector 46 comprises means for detecting a condition in which the transformed current $I_D'$ through the resistor $R_o$ exceeds a predetermined threshold value which is greater than the value at normal rated current. For example, at a typical normal rated load current, $I_D=36,000$ amps, $I_D'=4.3$ amps. Under these conditions, the threshold value will be set at about 110% to 120% of normal rated current, i.e., 4.8 to 5.2 amps. More particularly, the failure detector 46 is actuated by voltage $R_o \times I_D'$, where $I_D'$ is the transformed current representing a value in excess of the predetermined value. The detector 46 also includes means for indicating such a condition. Exemplary indicating means may comprise seal in lights and/or alarms.

The operation of the circuit 10 of FIG. 1 will now be more fully discussed. The extended wye to delta arrangement of the power transformer 18 is, for purpose of illustration, assumed to provide a phase shift between the primary voltage $e_p$ vector and the secondary $e_s$ vector of an angle $\phi$ of other than 30°. The wye connected primary current tranformers 36, 38, 40 provide no compensation for this phase shift. The appropriate adjustable phase shift compensation is provided by the double extended phase shifting autotransformer 34. More particularly, as shown vectorially in FIG. 1, the extension windings of the phase shifting autotransformer 34 are so proportioned that the phase shift relationship of the output vector $i_A$ to input vector $i_I$ is substantially identical to the phase shift relationship of the power transformer voltage vectors $e_s$ to $e_p$, and, the magnitudes of vectors $i_A$ and $i_I$ are substantially equal. This means that the currents flowing between the phase shifting autotransformer 34 and the instrument rectifier 44 are substantially identical to the currents flowing between the power transformer secondary and the power rectifier 26 except for the current transformer and power transformer magnitude transformation ratio. Thus, not only is the appropriate phase shift compensation provided by the double extended phase shifting autotransformer 34, but the phase shifting autotransformer 34 also provides unity current transformation. It should be noted that, the magnitude of phase shift provided by the autotransformer 34 can be made to be adjustable simply by providing symmetrical taps along the extension windings (not shown). With such tap points, the magnitude of phase shift can be varied while maintaining unity current transformation. This is to be contrasted with the operation of the autotransformer in the Jewell et al patent in which varying the phase shift varies the current transformation through values other than unity.

Zero sequence line current from lines 1, 2, 3, to the power transformer 18 requires equivalent transformed currents flowing from the current transformer secondary wye ends to the phase shifting autotransformer input terminals 1, 2, 3, and, to return from the phase shifting autotransformer neutral (N) to the secondary wye neutral of the current transformers 36, 38, 40. In order to ensure that this zero sequence current does not cause ampere turn unbalance on the phase shifting autotransformer 34, the closed tertiary 42 is provided. The closed tertiary 42 allows the necessary compensating current to flow in the windings thereof, thereby providing ampere turn balance on the phase shifting autotransformer. This makes the phase shifting autotransformer 34 a very low impedance to the flow of the zero sequence current. As a result, the zero sequence current is diverted from disturbing the measurements made within the instrument rectifier 44.

Referring now to the operation of the fuse failure detector 46, fuse failure may involve only one of a number of parallel paths which include a fuse 30 in series with a thyristor 28. That is, each of the three current paths shown in FIG. 1 typically comprises about twelve such paths, each including a fuse. Typically, if one fuse blows, the remaining paths will continue to operate. Nonetheless, the fuse interruption current (blown fuse current) will generally be very substantial as compared to normal current. Hence, the transformed current $I_D'$ through the resistor $R_o$ of the instrument rectifier 44 will, in many applications, exceed its normal current level, thereby producing operation of detector 46. This relationship can be calculated for a given application such that the detector 46 is actuated by a voltage $R_o \times I_D'$ which is above the threshold level. It is to be noted that the fuse blowing event is generally transient as the blowing of the fuse clears the fault from the circuit. This means that subsequent circuit operation is again normal unless additional faults occur. Depending upon the particular power system parameters, fault clearing times may be of the order of hundreds of microseconds to several milliseconds. In any event, it is preferable to provide the detector 46 with seal in gate means which are actuated by the threshold voltage level. These seal in gate means then actuate an annunciator, e.g., light/alarm, to signal the fuse failure. Then, an operator can replace the blown fuse at a time following its failure.

Figure 3:
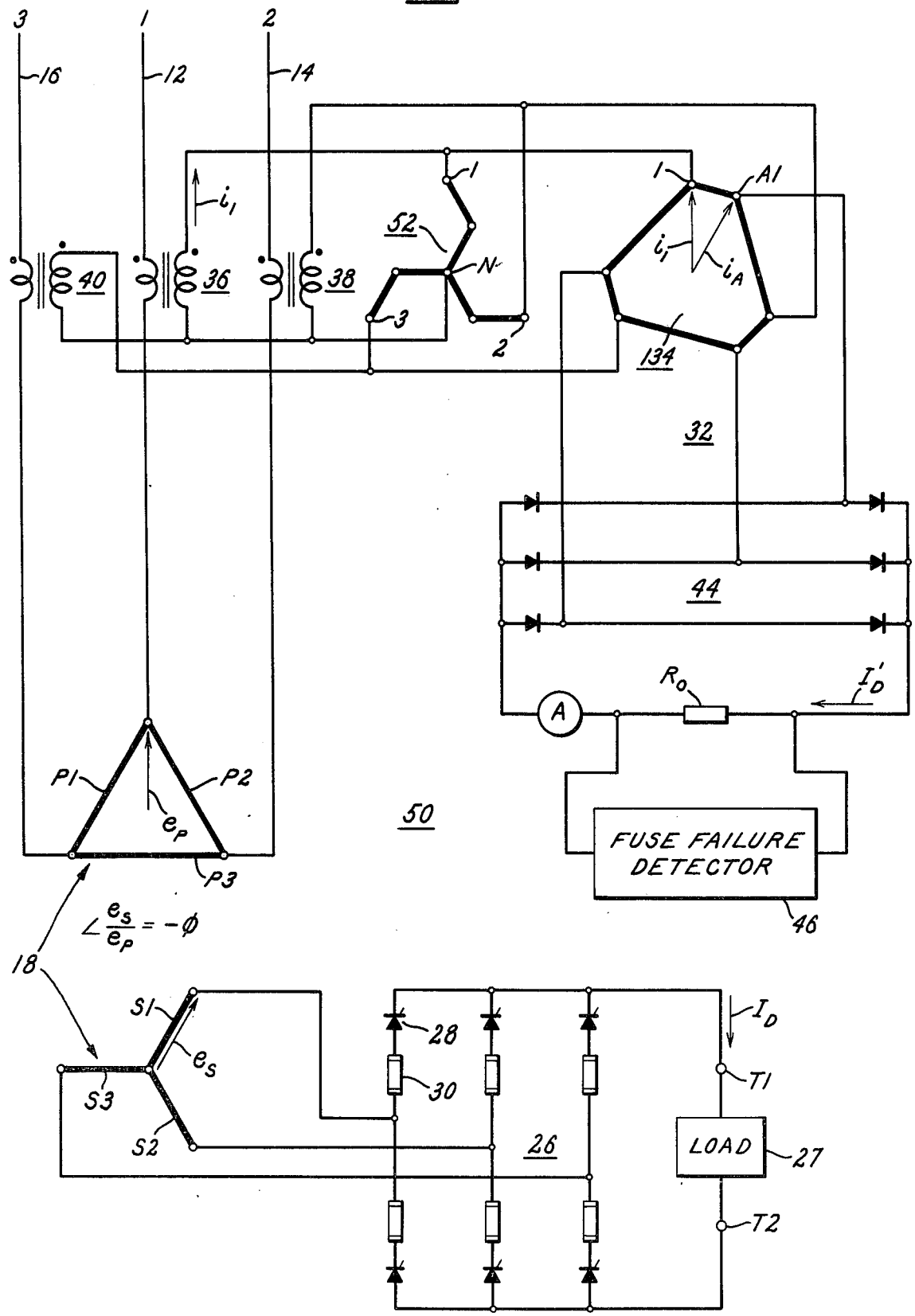
FIG. 3 is a schematic representation of another form of the present invention showing a power rectifier apparatus including a direct current measuring system.

Another power rectifier and dc measuring circuit of the present invention is shown in FIG. 3 and is generally designated 50. The power rectifier and measuring circuit 50 is similar to the circuit 10 of FIG. 1 so that, where possible, like reference numerals have been employed to designate like elements.

The power transformer 18 is shown, for purposes of illustration, as having a delta primary and a wye connected secondary which provide a current angle phase shift $\phi$ of 30°. The secondary winding of the primary line current transformers 36, 38, 40 are connected to a phase shifting autotransformer 134 and to a zig-zag autotransformer 52. The purpose of the zig-zag autotransformers 52 will be discussed later in connection with the operation of the circuit 50. The zig-zag autotransformer 52 is a true zig-zag arrangement, preferably employing a separate magnetizable core member, or core, for each phase. Each of the three cores is encompassed by two identical windings, thus, the zig-zag autotransformer 52 involves a total of six identical windings. The two identical windings on each core are preferably wound with low leakage flux therebetween. (This true zig-zag is to be contrasted with an extended wye arrangement in which three windings are of different turns than the three remaining windings). The phase shifting autotransformer 134 is of the type known as a truncated delta arrangement. By this it is meant that each of three separate magnetizable core members, or cores, is encompassed by two windings. One of these windings is a main, or greater turns winding, and the other is a minor, or lesser turns winding. (If the phase shift required is 60°, all the windings are of equal turns). All the main windings, and all the minor windings are respectively substantially identical. The windings of the three separate cores are interconnected in closed truncated delta form, as shown in FIG. 3. By constructing the vectors from the neutral or center of the truncated delta, the phase shift and the unity current transformation is depicted. The relative windings of the major and minor windings are chosen such that the angle $\phi$ of vector $i_A$ to vector $i_l$ is substantially identical to the angle of vector $e_s$ to vector $e_p$.

In the operation of the dc measuring circuit 50, the truncated delta arrangement 134 functions in substantially the same manner as the double extended arrangement 34 of the measuring circuit 10 of FIG. 1. More particularly, it exhibits the identical phase shift that is associated with the power transformer 18 as well as unity current transformation. However, the truncated delta arrangement 134 does not provide for zero sequence current flow. To provide capability for such flow, the neutral (N) of the zig-zag autotransformer 52 is connected to the neutral of the wye formed by the secondary windings of the line current transformers 36, 38, 40. Under these circumstances, zero sequence current can flow as follows: out of the ends of the wye connected line current transformers 36, 38, 40; into the associated terminals 1, 2, 3, of the zig-zag autotransformer 52; through the zig-zag autotransformer 52 windings to its neutral (N); and return to the line current transformer secondary neutral. The zig-zag autotransformer 52 provides a low impedance to the zero sequence current flow, and hence, provides a suitable path therefor. The fuse detector 46 will not be discussed in connection with the circuit 50 as its operation is substantially the same as that described in connection with the circuit 10 of FIG. 1.

Figure 4:
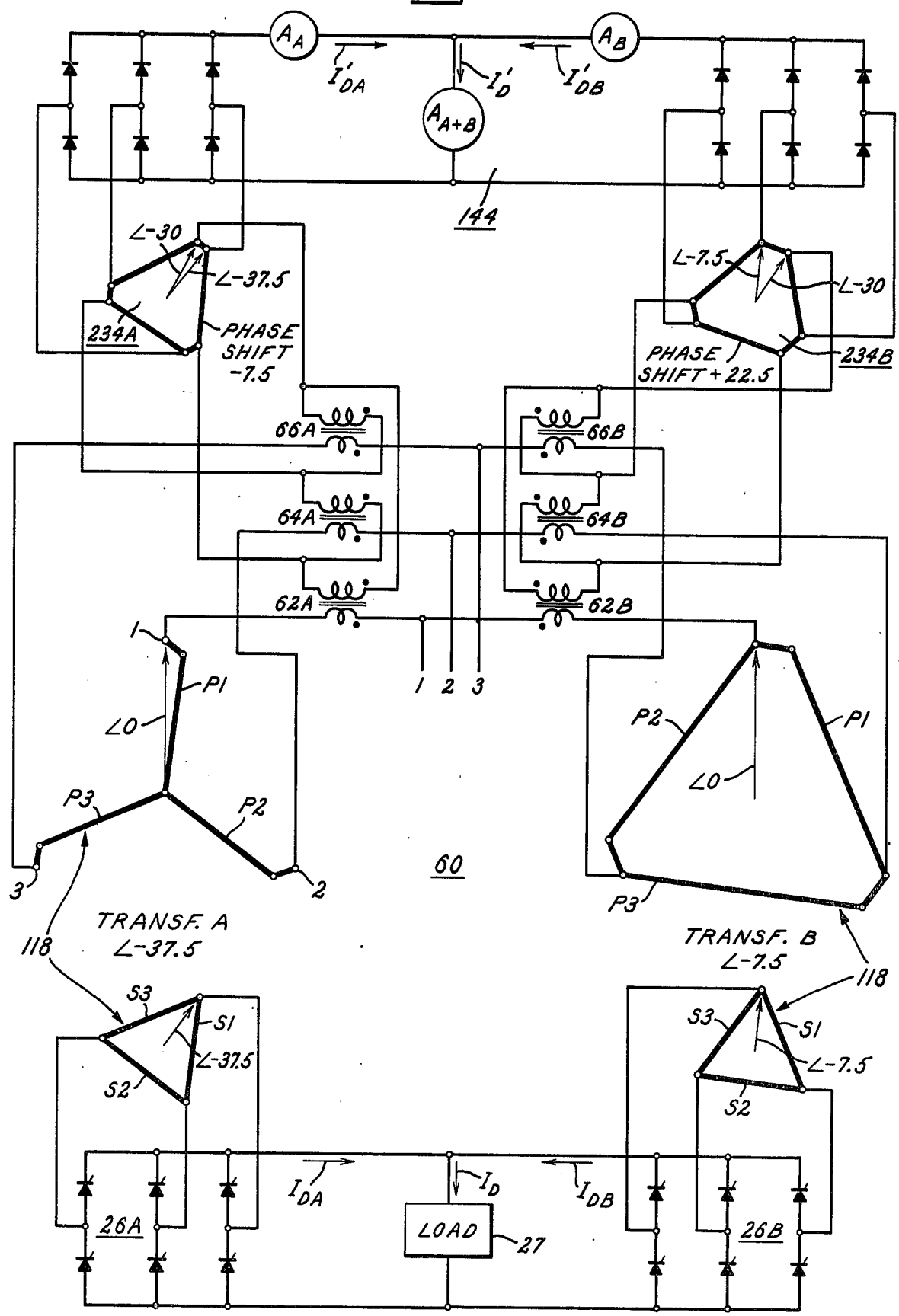
FIG. 4 is a schematic representation of another form of the present invention showing a power rectifier apparatus including a direct current measuring system.

Another dc measuring system of the present invention is shown in FIG. 4 and is generally designated 60. The measuring system 60 is similar to the measuring systems 10 and 50 of FIGS. 1 and 3 so that, where possible, like reference numerals have been employed to designate like elements.

The measuring system 60 is shown in connection with two power transformers 118, hereinafter also designated A and B. As is known in the art, six pulse systems, such as those hereinbefore in FIGS. 1 and 3, can be improved by going to a higher pulse system. For example, problems due to harmonics in a six pulse system can be minimized by going to a twelve or twenty four pulse system. The twelve and twenty four pulse systems are typically obtained by combining a number of six pulse systems at a predetermined phase angle therebetween. For example, in FIG. 4, the power transformers A and B are combined to the load 27 through multiphase rectifiers 26A, 26B. The angle of −30° between the secondaries of the two transformers A and B causes the combined system to function as a twelve pulse system. A twenty four pulse system (not shown) can be obtained by combining two such twelve pulse systems with an angle of 15° displacement therebetween.

In the measuring system 60, the power transformer A includes an extended wye primary and a delta secondary exhibiting −37.5° phase shift. Power transformer B includes a truncated delta primary and a delta secondary exhibiting a −7.5° phase shift. As mentioned previously, this system may comprise a portion of a twenty-four pulse system. The power transformers A and B supply three phase double way bridges 26A, 26B which are connected in parallel to supply a common load 27.

The primary line current transformer secondaries 62A, 64A, 66A and 62B, 64B, 66B are respectively cconnected in delta to each exhibit a −30° phase shift. (Note they could also be connected in delta to exhibit a +30° phase shift). The delta connection provides a circulating path for the induced zero sequence components of the primary line currents, if such exist. The unity gain phase shifting current transformers, designated 234A, 234B, illustrated in truncated delta form, provide respectively −7.5° and +22.5° phase shift for the primary currents associated with the power transformers A and B. The instrument rectifier 144 is similar to the instrument rectifiers of the six pulse systems of FIGS. 1, 3, but includes several modifications thereto. The instrument rectifier 144 preferably includes three dc measuring instruments, designated $A_A$, $A_B$, $A_{A+B}$. Instrument $A_A$ measures the dc load current $I_{DA}$ provided by the transformer A; instrument $A_B$ meausres the dc load current $I_{DB}$ provided by transformer B; and instrument $A_{A+B}$ measures the total dc load current $I_D$ provided to the load 27. It is to be noted that, the unity current transformation of the phase shifting current autotransformers 234A, 234B is particularly desirable for this system. More particularly, the phase shifting operation introduces no additional error into the measurement process.

The power rectifier and direct current measuring circuit of the present invention has hereinbefore been described in connection with embodiments which preferably included the following: means for providing substantially unity current transformation in the phase shifting autotransformer; means for handling zero sequence current; and fuse detector means. However, it is to be noted that these three features need not all be present at the same time. For example, if zero sequence capability is not needed, the tertiary windings 42 of the circuit 10 in FIG. 1 and the zig-zag autotransformer 52 of the circuit 50 of FIGS. 2 may be omitted. Also, although the embodiments hereinbefore described have included a power rectifier circuit employing thyristors, other arrangements may be substituted therefore. For example, such arrangements may include diodes or a combination of diodes with saturating reactors.

It is to be appreciated that the phase shifting autotransformer employed in the present invention to provide the proper phase angle compensation and unity current transformation need not be adjustable but may instead comprise a fixed phase shift, e.g., 30°. Also, although it is generally preferable to provide three separate magnetizable cores, one for each phase (in a three phase system), a single magnetizable core member having three separate core legs may also be provided. Further, although the present invention has been described in connection with a three phase power system, it is to be appreciated that the present invention is generally applicable to multiphase power systems including 6 phase, 12 phase or 36 phase circuits used in very high power rectifiers.

While we have illustrated preferred embodiments of our invention, many modifications will occur to those skilled in the art and we therefore wish to have it understood that we intend in the appended claims to cover all such modifications as fall within the true spirit and scope of our invention.

What we claim as new and desire to secure by Letters Patent of the United States is:

1. In a system for measuring the magnitude of direct output current from a multiphase power rectifier having an input circuit including a multiphase power transformer, said power transformer having primary and secondary phase windings connected to provide a phase shift between the multiphase primary and secondary line currents coupled by said power transformer, said system including primary line current transformers for measuring each of said primary line currents, a phase shifting current autotransformer comprising multiple phase windings coupled by separate magnetizable core members in each phase, said core members being designed for normal operation below saturation, means connecting said line current transformer secondary windings to primary windings of said phase shifting current autotransformer, said phase shifting current autotransformer providing a phase shift which when combined with the phase shift of said line current transformers is vectorially equal to the current phase shift of said power transformer, a multiphase instrument rectifier connected to the secondary windings of said phase shifting current autotransformer, and a direct current measuring instrument connected to the output terminals of said instrument rectifier, wherein the improvement comprises:

symmetrical phase shifting means for rendering the transformation ratio of said phase shifting current autotransformer substantially unity.

2. A system in accordance with claim 1 in which said symmetrical phase shifting means comprises said phase shifting autotransformer in a double extended arrangement.

3. A system in accordance with claim 2 in which said double extended arrangement is in wye form and in which said line current transformers have secondary windings each connected at one end to a common neutral terminal.

4. A system in accordance with claim 3 which includes zero sequence capability means for protecting against zero sequence current damage while preserving measurement accuracy.

5. A system in accordance with claim 4 in which said zero sequence capability means comprises a delta connected tertiary winding coupled to said phase shifting current autotransformer.

6. A system in accordance with claim 1 in which said symmetrical phase shifting means comprises said phase shifting autotransformer in a truncated-delta arrangement.

7. A system in accordance with claim 6 in which said line current transformers have secondary windings each connected at one end to a common neutral terminal.

8. A system in accordance with claim 7 which includes zero sequence capability means for protecting against zero sequence current damage while preserving measurement accuracy.

9. A system in accordance with claim 8 in which said zero sequence capability means comprises a zig-zag transformer connected between said line current transformers and said phase shifting autotransformer, said zig-zag transformer and said line current transformers having neutrals which are connected together.

10. A system in accordance with claim 1 which includes a plurality of said multiphase power transformers coupled to said multiphase power rectifier.

11. A system in accordance with claim 1 in which said multiphase power rectifier includes a fuse in each leg thereof and said multiphase instrument rectifier includes fuse failure detector means, said fuse failure detector means being responsive to a predetermined threshold value of current as seen by said instrument rectifier.

12. A system in accordance with claim 1 in which said multiphase power transformer comprises three phases.

13. In a system for measuring the magnitude of direct output current from a multiphase power rectifier having an input circuit including a multiphase power transformer, said power transformer having primary and secondary phase windings connected to provide a phase shift between the multiphase primary and secondary line currents coupled by said power transformer, said system including primary line current transformers for measuring each of said primary line currents, a phase shifting current autotransformer comprising multiple phase windings coupled by separate magnetizable core members in each phase, said core members being designed for normal operation below saturation, means connecting said line current transformer secondary windings to primary windings of said phase shifting current autotransformer, said phase shifting current autotransformer providing a phase shift, which when combined with the phase shift of said line current transformer is vectorially equal to the current phase shift of said power transformer, a multiphase instrument rectifier connected to the secondary windings of said phase shifting current autotransformer, and a direct current measuring instrument connected to the output terminals of said instrument rectifier, wherein the improvement comprises:
said multiphase power rectifier includes a fuse in each leg thereof and said multiphase instrument rectifier includes fuse failure detector means, said fuse failure detector means being responsive to a predetermined threshold value of current as seen by said instrument rectifier.

14. In a system for measuring the magnitude of direct output current from a multiphase power rectifier having an input circuit including a multiphase power transformer, said power transformer having primary and secondary phase windings connected to provide a phase shift between the multiphase primary and secondary line currents coupled by said power transformer, said system including primary line current transformers for measuring each of said primary line currents, a phase shifting current autotransformer comprising multiple phase windings coupled by separate magnetizable core members in each phase, said core members being designed for normal operation below saturation, means connecting said line current transformer secondary windings to primary windings of said phase shifting current autotransformer, said phase shifting current autotransformer providing a phase shift, which when combined with the phase shift of said line current transformer is vectorially equal to the current phase shift of said power transformer, a multiphase instrument rectifier connected to the secondary windings of said phase shifting autotransformer, and a direct current measuring instrument connected to the output terminals of said instrument rectifier, wherein the improvement comprises:
zero sequence capability means coupled to said phase shifting autotransformer for protecting against zero sequence current damage while preserving measurement accuracy, said zero sequence capability means being characterized by said line current transformers having secondary windings each connected to a common neutral terminal and said phase shifting autotransformer being in a truncated delta arrangement with a zig-zag transformer connected between said line current transformers and said phase shifting autotransformer, said zig-zag transformer and said line current transformers having neutrals which are connected together.

15. In a system for measuring the magnitude of direct output current from a multiphase power rectifier having an input circuit including a multiphase power transformer, said power transformer having primary and secondary phase windings connected to provide a phase shift between the multiphase primary and secondary line currents coupled by said power transformer, said system including primary line current transformers for measuring each of said primary line currents, a phase shifting current autotransformer comprising multiple phase windings coupled by separate magnetizable core members in each phase, said core members being designed for normal operation below saturation, means connecting said line current transformer secondary windings to primary windings of said phase shifting current autotransformer, said phase shifting current autotransformer providing a phase shift, which when combined with the phase shift of said line current transformer is vectorially equal to the current phase shift of said power transformer, a multiphase instrument rectifier connected to the secondary windings of said phase shifting autotransformer, and a direct current measuring instrument connected to the output terminals of said instrument rectifier, wherein the improvement comprises:
zero sequence capability means coupled to said phase shifting autotransformer for protecting against zero sequence current damage while preserving measurement accuracy, said zero sequence capability means being characterized by said line current transformers having secondary windings each connected to a common neutral terminal and said phase shifting autotransformer being in a double extended wye arrangement with a delta connected tertiary winding coupled thereto.

* * * * *